United States Patent [19]
Platt et al.

[11] Patent Number: 5,917,165
[45] Date of Patent: Jun. 29, 1999

[54] TOUCH SWITCH WITH FLEXIBLE, INTERMEDIATE CONDUCTIVE SPACER AS SENSOR BUTTON

[75] Inventors: Nils Platt, Zaberfeld-Leonbronn; Wilfried Schilling, Kraichtal; Bernhard Goetz, Zaisenhausen; Uwe Kreiter, Oberderdingen, all of Germany

[73] Assignee: E.G.O. Elektro-Geraetebau GmbH, Germany

[21] Appl. No.: 09/024,573

[22] Filed: Feb. 17, 1998

[30] Foreign Application Priority Data

Feb. 17, 1997 [DE] Germany .......................... 197 06 168
Nov. 29, 1997 [DE] Germany ...................... 297 21 212 U

[51] Int. Cl.⁶ .......................... H03K 17/975; H01H 1/02
[52] U.S. Cl. ........................................... 200/600; 200/511
[58] Field of Search ............................... 200/85 R, 85 A, 200/86 R, 512–517, 600, 46, 312, 511; 338/99, 114, 160; 341/33

[56] References Cited

U.S. PATENT DOCUMENTS

| | | | |
|---|---|---|---|
| 3,125,739 | 3/1964 | Deibel et al. | 338/99 |
| 3,386,067 | 5/1968 | Costanzo | 338/100 |
| 3,509,296 | 4/1970 | Harshman et al. | 200/46 |
| 3,648,002 | 3/1972 | Du Rocher | 338/114 X |
| 3,845,261 | 10/1974 | Blinkilde | 200/85 A |
| 3,951,250 | 4/1976 | Pointon et al. | 200/600 |
| 4,322,983 | 4/1982 | Sado | 338/114 X |
| 4,380,007 | 4/1983 | Steinegger | 341/33 |
| 4,414,452 | 11/1983 | Denley | 200/312 X |
| 4,640,994 | 2/1987 | Komaki | 200/5 |
| 4,665,324 | 5/1987 | Ogino et al. | 307/116 X |
| 4,924,222 | 5/1990 | Antikidis et al. | 200/600 X |
| 5,017,833 | 5/1991 | Clarke et al. | 315/51 |
| 5,313,840 | 5/1994 | Chen et al. | 73/763 |

FOREIGN PATENT DOCUMENTS

| | | | |
|---|---|---|---|
| 0013 279 | 12/1978 | European Pat. Off. | H03K 17/96 |
| 00 66 881 | 6/1982 | European Pat. Off. | H03K 17/96 |
| 0 286 747 | 10/1988 | European Pat. Off. | G10H 1/055 |
| 77 19 640 | 6/1977 | Germany | H03K 17/00 |
| 82 35 116 | 12/1982 | Germany | H03K 17/975 |

OTHER PUBLICATIONS

Burk A., "Momentary Switching Alternatives for Key Pad and Front Panel Applications", 8079 Electro Conference Record 18(1993), New York, NY, USA.

Primary Examiner—J. R. Scott
Attorney, Agent, or Firm—Quarles & Brady

[57] ABSTRACT

A touch contact switch has a sensor key or button with a spatially extended, electrically conductive foam or flexible plastic or rubber body. The switch is operated by contact or approach. The sensor button essentially forms one pole of a capacitor and is electrically connected to an evaluating circuit of the touch contact switch, wherein switching is initiated as a result of a capacitance change in consequence of approach or contact. The sensor button can be bonded directly on a mounting plate of the associated electrical evaluating circuit or can be engaged by a pin or the like. The body can be flush to the underside of a cover, which forms or contains the contact surface. The body can include an opening along the longitudinal axis in which is insertable a LED.

19 Claims, 3 Drawing Sheets

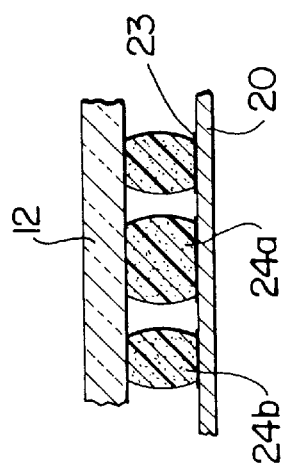
FIG. 2a
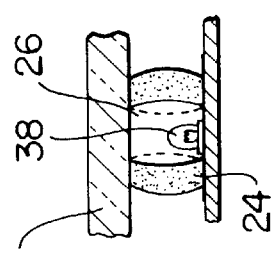
FIG. 3a
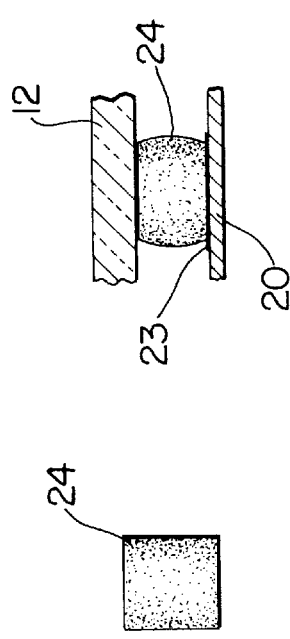
FIG. 4a
FIG. 5a
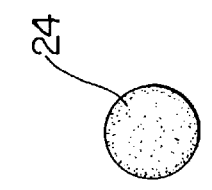
FIG. 2b
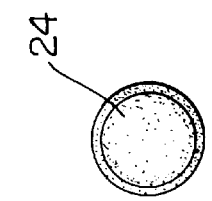
FIG. 3b
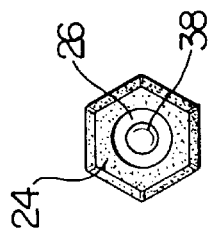
FIG. 4b
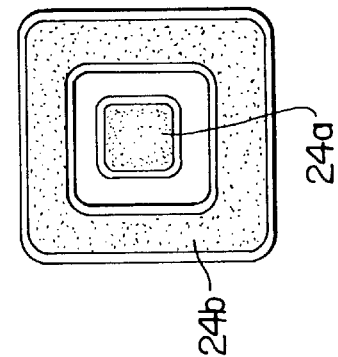
FIG. 5b

TOUCH SWITCH WITH FLEXIBLE, INTERMEDIATE CONDUCTIVE SPACER AS SENSOR BUTTON

FIELD OF APPLICATION AND PRIOR ART

In many electrical or electrically controlled installations, apparatus and equipment, mechanical switches are replaced by so-called touch contact switches, which are for example operated by contact or the approach of a finger. The actual switching function is performed by electronic switches or relays, which are activated as a consequence of the contact of the sensor button or key of the touch contact switch. Such switches are frequently used on elevators or for similar purposes, as well as for controlling electric cookers. The advantage arises that, particularly in the case of glass ceramic cookers, the operation can take place through the glass ceramic plate, such that no openings are needed.

The sensor elements of known touch contact switches are generally provided individually or in a plurality, in the form of metallized fields on plates or boards, for example in printed circuit boards, which are pressed by metal springs onto the underside of the cover plate, for example a hard glass or glass ceramic plate of a cooker. The provision of the metal springs, the adaptation of the sensor button to the cover plate and assembly and transportation problems make usage more difficult.

PROBLEM AND SOLUTION

The problem of the invention is to provide a touch contact switch with the sensor button being improved compared with the prior art and which can in particular be more easily manufactured and assembled, which causes no problems during transportation and operation and whose effectiveness is also improved.

This problem is solved in that the sensor key or button is an intrinsically flexible, spatially extended, three dimensionally variable and electrically conductive body. Preferably the sensor button is made from an electrically conductive plastic or rubber material, particularly in block form, which also covers voluminous bodies, which are in the form of parallelepipeds, rings, hollow cylinders, etc. It is particularly preferably made from an electrically conductive foam material. Particularly suitable are soft elastic plastics, artificial rubber or natural rubber, which are rendered electrically conductive with carbon (carbon black), metal or similar inclusions. For higher temperatures inter alia silicones are suitable, which can be readily foamed in the same way as other soft elastic plastics. Thus, the sensor button need only be a correspondingly shaped piece of such a material, for example a cylinder, which is pressed from below onto the cover or cover plate. This gives rise to the advantage that the sensor button fully engages on the cover, even if the latter is uneven. Particularly the undersides of glass ceramic plates in radiant cookers often have a profiling or corrugation. In the case of rigid sensor buttons this produces an effectiveness-reducing gap, whereas the flexible sensor button according to the invention can engage fully or snugly. The necessary spring action required for application preferably results from the inherent elasticity of the body.

In a preferred embodiment of the invention the sensor button has at least one opening, which is in an outer boundary surface of the sensor button, which is directed towards a cover or an operating field of the touch contact switch. Such an opening permits a plurality of functional features and design possibilities for the sensor button or touch contact switch. A preferred possibility leading to the marking of the touch contact switch or sensor button provides for the arrangement in the opening of lighting means, for example LEDs, bulbs or other light-conducting components, such as light guides. The opening is preferably substantially linear and in particular with a substantially constant cross-section.

As a result of the heat evolution and power consumption, use is preferably made of LEDs or light guides. LEDs offer the advantage of an individual lighting matched to each touch contact switch, with all the resulting possibilities for modifications to an illumination effect with respect to intensity and/or duration. Illuminated signs with such a contact switch can also indicate to the user certain switching states or possibilities and consequently guide the user. In the case of a control for an electric cooker, for example only those touch contact switches are illuminated which can perform an allowed function at the particular time. It is also possible to use combinations of several lighting means, for example light guides for a permanent illumination, possibly as a function of the brightness of the environment, and LEDs for individual marking dependent on the operating state.

In another embodiment of the invention, it is possible to provide a recess, particularly on a boundary surface with the opening facing the operating field, on the sensor button for fixing and/or receiving a pattern disk with a cutout representing a symbol or with different types of light-permeable inserts. Thus, a sensor button of this type not only constitutes a diffuse light source, but also an illuminated symbol, which is clearly visible as such, for example through a glass ceramic plate of a cooker. Thus, a user is informed in a very elegant and attractive manner of the significance of a touch contact switch designed in this way. It is also possible for the light-emitting body of the lighting means to have a shape corresponding to the symbol, which in particular is possible with LEDs. A marking of the touch contact switch by printing on or under the cover can be obviated. Both an opening and also the lighting means therein, optionally with a symbol disk, do not or only insignificantly impair the characteristics of the sensor button in the case of suitable dimensioning.

It is also easily possible to fit the sensor button. It can for example be fitted by an optionally conductive adhesive or a double adhesive tape, which for example fixes the sensor button directly onto the contact surface of a mounting plate containing the electrical switching components for the touch contact switch or the cover. It is also possible to carry out fixing by means of a pin soldered to such a mounting plate and which projects into the sensor button and simultaneously fulfils a contact function. It is also possible to carry out fixing in that in the case of a construction with an opening the sensor button is merely inverted over a LED or the like dimensioned for this purpose and is consequently secured until it is clamped between the substrate and the cover at the time of final installation.

The sensor button can have a not inconsiderable electrical resistance, for example up to 500 kiloohms. It is only electrically connected on one side and essentially forms one pole of a capacitor, whose capacitance is varied by the approaching finger of the operator. In certain circumstances, considerable electrical resistance of the sensor button material tends to have a positive effect on the characteristics of the contact switch. As a result, during capacitive coupling through the glass to the human finger there is a very good filtering action with respect to electrical disturbance variables. This is very important with respect to the constantly increasing EMC problem. The filtering action is mainly achieved against the irradiation of RF interference variables, but its own spurious emission can also be avoided or reduced. Thus, a R-C and/or L-C filter is formed.

As a result of the full engagement on the cover plate, there is only a limited stray capacitance. The compressive stress between the substrate and the cover plate, which acts on the sensor button, is to be maintained in operation in order to permanently ensure the planar engagement.

Although a capacitive touch contact switch is the preferred field of application, it would also be possible to form with the sensor button a contact switch operated by a change of shape, for example a compression of the sensor button. It is thereby possible to utilize a property of the material so that its electrical resistance changes upon a change of shape.

Through the admixing of ferritic materials the sensor button can be given ferritic properties, which improve the inductive resistance of the sensor and consequently lead to a further improvement of the electromagnetic compatibility (EMC characteristics).

It is clear that a touch contact switch with a sensor button according to the invention has numerous advantages. The sensor button can easily be produced as a one-piece body, it is extremely inexpensive and also easy to assembly, for example by bonding or clipping on. Each sensor button can easily be constructed as a single body, whose positioning is determined by its substrate, for example the mounting plate. This also facilitates the precise, gapfree engagement on the glass underside. However, the spring tension for achieving a good, full engagement need only be very small. The surface of the sensor button is usually oxidation-free and is scarcely moisturesensitive with respect to the effectiveness. It is also advantageous when used in the electric heating sector that the sensor element has good thermal insulation properties. It therefore protects the electronics against inadmissible heating, also in the case of an incorrect positioning of a hot cooking vessel on the sensor surface.

Further advantages arise at the time of assembly. For example, the individual sensor buttons can be supplied to automatic assembly machines in rod form and cut to length in situ. However, it is also easily possible to assemble a belted or bulk material form, also in automatic assembly machines. The sensor button could also be supplied for assembly on a protective foil covering the adhesive coating. Transportation both during and after the assembly of the touch contact switch is simplified by the lack of bulky metal springs.

These and further features can be gathered from the claims, description and drawings and the individual features, both singly or in the form of subcombinations, can be implemented in an embodiment of the invention and in other fields and can represent advantageous, independently protectable constructions for which protection is hereby claimed. The subdivision of the application into individual sections and the intermediate titles in no way limit the general validity of the statements made thereunder.

BRIEF DESCRIPTION OF THE DRAWINGS

An embodiment of the invention is described hereinafter relative to the drawings, of which:

FIGS. 2a and 2b are a side view and a plan view of a body forming a sensor button in the unassembled state;

FIGS. 3a and 3b are a side view and a plan view of a sensor buttons in the installed state;

FIGS. 4a, 4b, 5a and 5b are sectional views and plan views of sensor buttons in the installed state;

FIG. 9b is the equivalent electrical circuit of the sensor button of FIG. 9a.

DETAILED DESCRIPTION OF EMBODIMENTS

Figure 1:
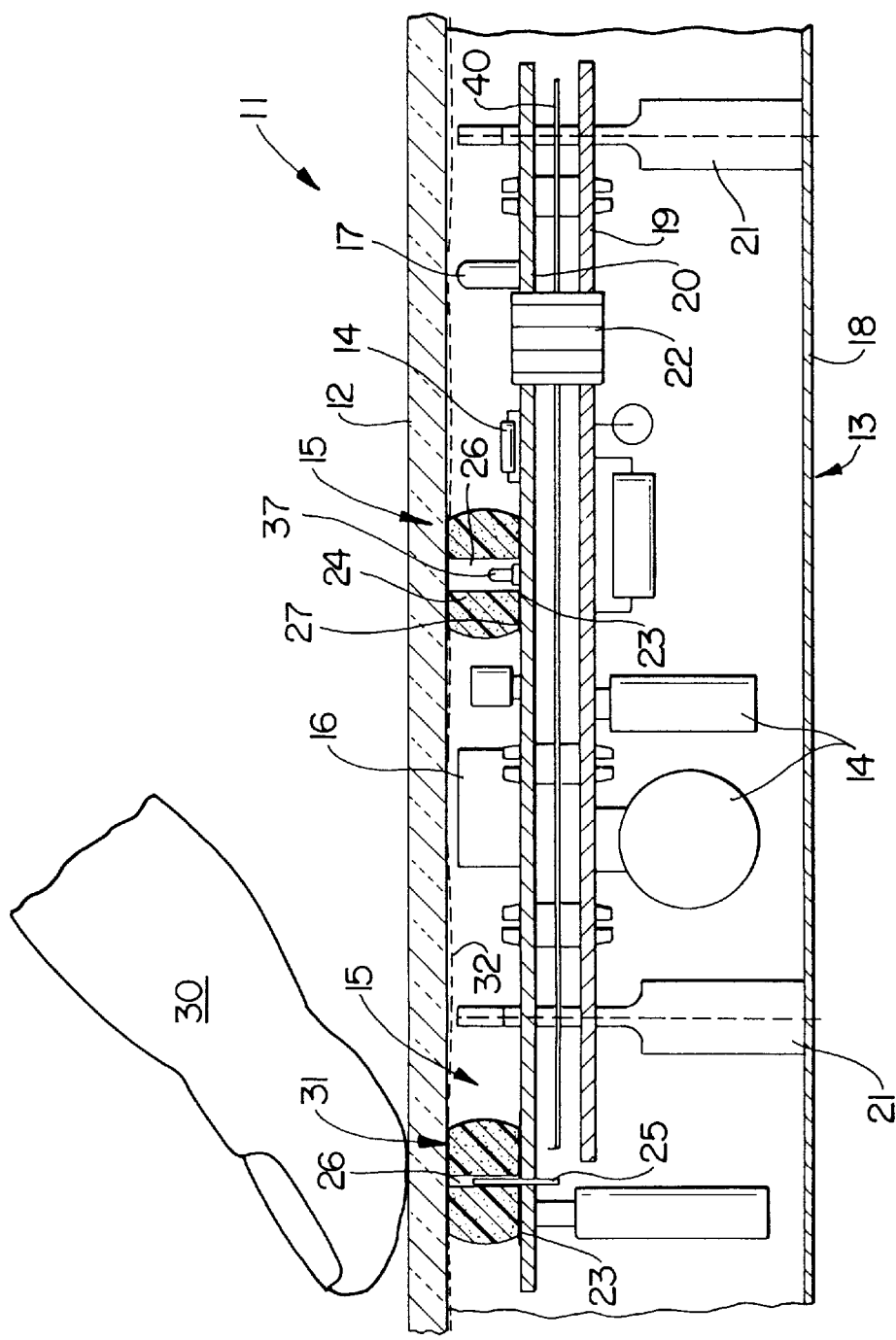
FIG. 1 is a vertical section through a glass ceramic plate with a touch contact switch field thereunder

FIG. 1 shows a vertical section through part of a cooker 11 with a glass ceramic plate 12 under which is located a control or regulating unit 13. The unit 13 contains electronic and/or electromechanical components 14 of touch contact switches 15, display devices 16, 17 and other elements, which are combined optionally into multipurpose subassemblies for the contact switches and/or other regulating and control devices for the electric cooker.

In a casing 18 protecting the control and regulating unit 13 against the remaining, radiant heater-containing underside of the glass ceramic plate are arranged in parallel two mounting plates 19, 20 by means of holders 21 so as to be parallel to the glass ceramic plate 12. They are constructed as printed circuit boards and contain on their remote sides, i.e. on the underside of the lower circuit board 19 and on the top of the upper circuit board 20, the components 14 and preferably on the lower circuit board the larger components, such as relays or larger capacitors, and on the top smaller components, which can for example be applied by SMD technology. On the top are also provided the display elements, such as a numerical display 16, such as a 7-segment display, and light emitting diodes 17. The conductors or conductor tracks of the two mounting plates are interconnected by flat cables 22 or other connecting elements. An electrically insulating intermediate plate 40 can be placed between the mounting plates 19, 20.

The upper mounting plate 20 has at the points provided for actuation metallic contact faces 23 applied together with the conductors and to which are fitted the sensor keys or buttons 24. The contact faces 23 carrying the sensor buttons 24 can also be located on other components, which do not belong to the evaluating circuit. The sensor buttons 24 for example comprise cylindrical bodies of a flexible, spatially extended, three-dimensionally variable, electrically conductive material, as is shown in FIGS. 2 to 7.

The body of the sensor button 24 can be made from flexible, i.e. soft elastic plastic or rubber, preferably in foamed form and the material can be made electrically conductive by inclusions of electrically conductive materials, for example graphite (carbon black), metal powders or other media. FIG. 1 shows on the left-hand side that a sensor button 24 is fixed with a pin 25 soldered in the printed circuit board and engaged in a prepared opening 26 in the sensor button and fixes the same. In the case of a more flexible foam it would also be possible to punch into the solid material. This pin can also ensure or improve the electrical connection. Roughly in the centre of FIG. 1 is shown a sensor button 24, which is bonded by a conductive adhesive 27 to the contact face 23. It would also be possible to use a conductive, double-sided adhesive tape. It also has a through opening 26 in which is located a LED 37, which on the mounting plate is connected in not shown manner to the control or regulating unit. In place of a LED it would also be possible to connect a bulb or light guide, which would at least partly project into the opening 26.

In the area of the opening 26 the contact face 23 advantageously has a recess having the dimensions of the opening, so that lighting means located therein with their electrical connections do not give rise to undesired contacts or even short-circuits. The conductors for lighting means, such as LEDs, are preferably located on the other side of the mounting plate to the contact face 23 and in this case on the underside of the mounting plate 20.

FIGS. 2a and 2b show a sensor button 24 prior to assembly and fitting beneath the cover plate 12. In this case it is a circular cylindrical body, which can be applied with one of its end faces to the contact face, whereas the opposite end face can engage on the underside of a cover plate.

FIGS. 3a and 3b show the sensor button 24 of FIGS. 2a and 2b in the installed state. It is possible to see that it is deformed in barrel-shaped manner, because it is engaged on the cover plate 12 under a certain compressive stress. Pressing can take place with a constant spring tension or constant spacing. Due to the good spring action of the sensor button material, an adequate action is in all cases ensured.

FIGS. 4a and 4b show a hexagonal construction, i.e. the body has the shape of a cylinder with a hexagonal base. Correspondingly the sensor button 24 has a hexagonal barrel shape on insertion. In an opening 26 is provided a lighting means, in this case a bulb 38, which emits upwards through the glass ceramic plate 12.

FIGS. 5a and 5b show a sensor button comprising two fields. The inner portion of the sensor button 24a has a rounded, square shape and represents the actual switching button, whereas a square, annular portion 24b, surrounding said first portion, forms a switching surface for an overflow protection. In order to ensure that the touch contact switch is not operated by an object moved or guided over it, the evaluating circuit is provided in such a way that a simultaneous or successive operation of both areas 24a, 24b does not lead to switching. Only a planned contact with a finger in the center, i.e. an operation solely of the switching face 24a leads to a switching result. This can also be carried out without difficulty using the sensor button according to the invention. It would be possible to provide the entire arrangement 24a, 24b or other specially shaped or arranged portions on a foil, which is drawn off at the time of mounting.

Figure 6:
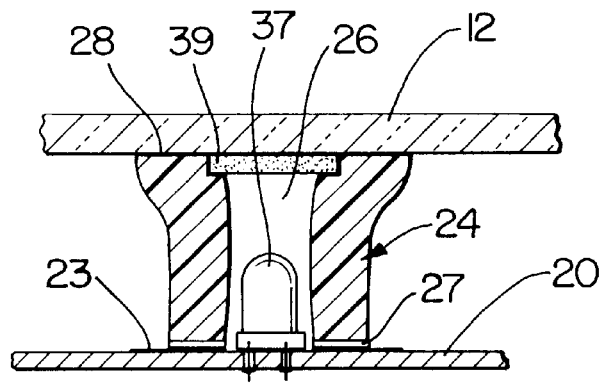
FIG. 6 is a mushroom-shaped sensor button in the assembled state in cross-section with a pattern or symbol disk.

The cross-sectional shape of the buttons need not be round or square. FIG. 6 for example shows a cross-sectionally circular, but in side view roughly mushroom-shaped sensor button 24. The upper sensor face 28 is larger than the lower mounting face 29 engaging on the contact face 23, so that the sensor button is roughly mushroom-shaped. This not only saves space on the mounting board 20, but in particularly advantageous manner use is made of a symbol disk 39 inserted in a correspondingly shaped cutout within the upper sensor face 28 at the upper outlet of the opening 26. It is illuminated from below by a LED 37 located in the opening 26.

Figure 7:
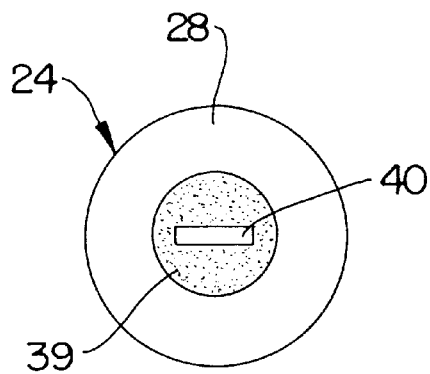
FIG. 7 is a plan view of the sensor button of FIG. 6.

FIG. 7 is a plan view of the sensor element of FIG. 6, the symbol disk 39 inserted centrally in the sensor face 28 or a corresponding recess at the upper end of the opening 26 being clearly visible. This is not limited to the round construction shown in FIG. 7, but can instead assume a random shape. In the centre of the symbol disk 39 is located a symbol 40, which is in this case a minus sign and is in the form of a cutout. However, it would also be possible to use an insert of a material with a different light-permeability in the shape of the symbol 40, said material preferably having a higher light permeability than the surrounding symbol disk 39. Thus, through the illumination of the symbol disk 39, it is possible to represent a symbol 40, which can be clearly recognized from above through the glass ceramic plate 12.

Figure 8:
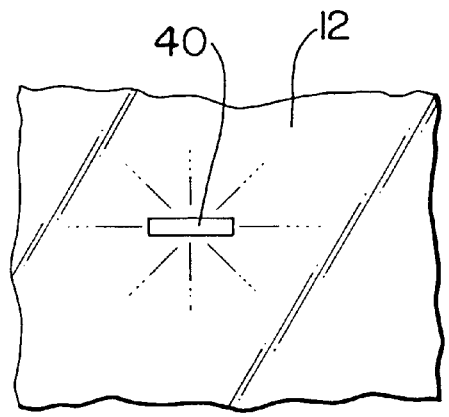
FIG. 8 is a view of the sensor button of FIG. 6 through a glass ceramic plate.

The symbol can be in the form shown in FIG. 8 for example. It is represented to the user observing the glass ceramic plate 12 from above as a more or less strongly illuminating symbol 40. In this case the said symbol characterizes a minus sign and indicates to the user who, by touching this point with the finger, has initiated a reducing process, for example a power reduction. The symbol could also be in the form of a figure, which for example represents a set power stage.

Figure 9A:
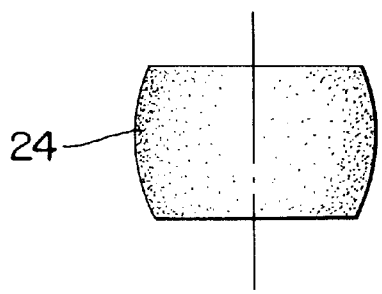
FIG. 9a is a side view of sensor button.
Figure 9B:
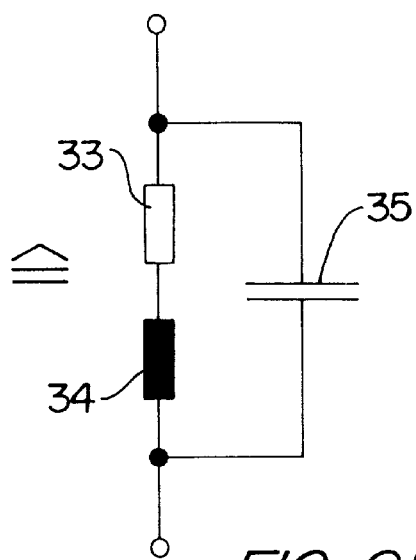

FIG. 9a is a side view of a sensor button 24 and FIG. 9b shows the equivalent circuit of this sensor button 24, which comprises a series connection of the equivalent resistor 33 formed by the electrical resistance in the sensor button body and an inductive resistance 34 which arises or is variable through the volume extension of the sensor button. In this case, corresponding to FIGS. 1 and 3a to 6, the sensor button is partly compressed. The parallel capacitor 35 is connected in parallel to the series connection of resistors 33 and 34.

This equivalent circuit reveals further advantages of the special shaping of the sensor button 24. In particular the equivalent resistor 33, but also the inductive resistor 34 damp or reduce disturbing influences from the outside on the sensor button and circuit. The magnitude of the inductive resistor can be influenced by admixing ferritic materials. The volume extension of the sensor button inter alia improves its EMC characteristics to a significant extent compared with the known sensor elements, for example in flat form.

FUNCTION

For the construction of a cooker in a hob, i.e. a flat sheet metal tray or trough, is placed a plurality of electric radiant heater elements located in flat sheet metal trays and pressed by means of springs onto the underside of a glass ceramic plate 12 covering the hob. One area of the glass ceramic plate is unheated. In this area is located the control and regulating unit 13 surrounded by its own casing 18. Through a corresponding decoration of the glass ceramic plate switching fields for the touch contact switch are formed or marked by corresponding colouring. There are also undecorated fields for the display elements 16, 17.

For operating the cooker, namely either for switching on and/or for setting a particular power value, the user contacts with the finger 30 a sensor field 31, which is either in the form of a recess in the broken line represented decoration 32 of the glass ceramic plate, which can be provided on the top or bottom, or is indicated by lighting means installed in an opening 26 in a sensor button 24. As a result of the capacitance change occurring on the sensor button 24, which is electrically connected to the mounting plate and therefore to the evaluating circuit of the touch contact switch 15, switching is initiated. The evaluating circuit can be constituted by a conventional contact switch circuit. It is particularly advantageous to use the circuit shown and represented in the simultaneously filed patent application A 32 289 US entitled "Circuit arrangement for a sensor element".

The result of switching is indicated to the user by the resulting change of the numerical value displayed in the display 16 or the light emitting diode 17. Alternatively a switching result can be indicated by a change in the intensity or lighting frequency of the lighting means in the sensor button.

It is clear that the invention permits a compact construction and integration of the sensor switches in the circuit. Thus, the display 16 can be installed between the individual sensor buttons for example, without the display being impeded by a mounting plate carrying the said buttons. The preferred field of application is electric cooking and heating appliances. However, it is also possible to use the invention with other touch contact switches, in which the cover plate 12 is for example formed by the front panel of an operating field, which can be randomly positioned.

The opening 26 or the lighting means located therein do not impair the function of the sensor button 24. The surface of the opening 26 or a recess for the symbol disk 39 should represent less than half the total cross-sectional surface of the sensor button, for example approximately 30 to 40%.

We claim:

1. A touch contact switch being operated by contact or by approach comprising:

an evaluating circuit; and, a sensor button forming one pole of a capacitor and being electrically connected to said evaluating circuit, said sensor button being a flexible, spatially extended, three-dimensionally variable and electrically conductive body, wherein switching is initiated by a change in capacitance, the change in capacitance caused by an contact member approaching said sensor button or said contact member contacting said sensor button.

2. A touch contact switch according to claim 1, wherein the sensor button is placed below a cover and is pressed against the same.

3. A touch contact switch according to claim 2, wherein the sensor button has a surface or shape adaptable to the cover.

4. A touch contact switch according to claim 2, wherein the sensor button defines at least one cavity having at least one opening, said opening formed in an outer boundary surface of the sensor button, said outer boundary surface facing the cover or an operating field of the touch contact switch.

5. A touch contact switch according to claim 4, wherein in the cavity is provided at least one lighting means from the following group: LED, bulb and light guides.

6. A touch contact switch according to claim 4, wherein the cavity is substantially linear.

7. A touch contact switch according to claim 4, wherein the sensor button has a recess on a boundary surface with the opening facing the cover for the purpose of receiving a symbol disk with a cutout representing a symbol.

8. A touch contact switch according to claim 1, wherein the sensor button contains electrically conductive plastic or rubber material.

9. A touch contact switch according to claim 1, wherein the sensor button is mainly made from electrically conductive foam.

10. A touch contact switch according to claim 1, wherein the sensor button is fitted to a contact face of a substrate receiving at least one sensor button.

11. A touch contact switch according to claim 10, wherein the substrate is an electrical circuit board containing electrical circuit components.

12. A touch contact switch according to claim 10, wherein the sensor button is fitted by means of an adhesive at least to the contact surface.

13. A touch contact switch according to claim 1, wherein the sensor button only has one electrical connection.

14. A touch contact switch according to claim 1, wherein the sensor button is clipped on a contact or fixing pin.

15. A touch contact switch according to claim 10, wherein the sensor button is held between the cover and substrate under a pretensioning compressive stress.

16. A touch contact switch according to claim 1, wherein the sensor button has a contact face and an end furthest removed therefrom, and has an electrical resistance of 0 to 500 kiloohms between them.

17. A touch contact switch according to claim 16, wherein the sensor button has an electrical resistance dependent on a shape change.

18. A touch contact switch according to claim 1, wherein the material of the sensor button has ferritic properties.

19. A touch contact switch according to claim 1, wherein the sensor button has a one-piece, substantially cylindrical body with a round opening along its center axis between a cover and a substrate, the opening containing a LED for optical marking purposes.

* * * * *